(12) United States Patent
Friese et al.

(10) Patent No.: US 12,413,453 B2
(45) Date of Patent: Sep. 9, 2025

(54) INTERFERENCE-FREE TRANSMISSION OF SIGNALS BETWEEN DIFFERENT EARTH POTENTIALS

(71) Applicant: Robert Bosch GmbH, Stuttgart (DE)

(72) Inventors: Falko Friese, Ludwigsburg (DE); Edwin Eberlein, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 806 days.

(21) Appl. No.: 17/413,134

(22) PCT Filed: Dec. 6, 2019

(86) PCT No.: PCT/EP2019/083961
§ 371 (c)(1),
(2) Date: Jun. 11, 2021

(87) PCT Pub. No.: WO2020/120309
PCT Pub. Date: Jun. 18, 2020

(65) Prior Publication Data
US 2022/0070030 A1    Mar. 3, 2022

(30) Foreign Application Priority Data
Dec. 13, 2018    (DE) .................... 10 2018 221 586.3

(51) Int. Cl.
*H04L 25/02*    (2006.01)
*G08C 19/00*    (2006.01)
*H03K 17/18*    (2006.01)

(52) U.S. Cl.
CPC .......... *H04L 25/0274* (2013.01); *G08C 19/00* (2013.01); *H03K 17/18* (2013.01)

(58) Field of Classification Search
CPC ..... H03K 17/18; G08C 19/00; H04L 25/0274
See application file for complete search history.

(56) References Cited

U.S. PATENT DOCUMENTS

| 5,432,817 A | 7/1995 | Hormel et al. |
| 7,535,262 B2 * | 5/2009 | Abdoulin ................ H02M 7/06 327/333 |

(Continued)

FOREIGN PATENT DOCUMENTS

| CN | 101409695 A | 4/2009 |
| CN | 101447785 A | 6/2009 |

(Continued)

OTHER PUBLICATIONS

Translation of International Search Report for Application No. PCT/EP2019/083961 dated Jun. 24, 2020 (3 pages).

*Primary Examiner* — Menatoallah Youssef
*Assistant Examiner* — Khareem E Almo
(74) *Attorney, Agent, or Firm* — Michael Best & Friedrich LLP

(57) ABSTRACT

The invention relates to a coupler (1) for differential transmission of an analogue signal (3) coming from at least one transmitter (2) with a first earth potential (2a), via at least one first signal line (4a) and a second signal line (4b), to a receiver (5) with a second earth potential (5a), wherein the coupler (1) has a filter assembly (6) for the portions (3a, 3b) of the signal (3) being transmitted via the first signal line (4a) or via the second signal line (4b), wherein this filter assembly (6) is potential-free or uses the second earth potential (5a), and wherein the portions (3a′, 3b′) of the signal (3) filtered by the filter assembly (6) are brought together in a comparator (7) in order to form the signal (8) to be supplied to the receiver (5), and wherein the comparator (7) uses the second earth potential (5a). The invention also relates to a system (50) for signal transmission and a voltage transformer (100) comprising the coupler (1) and/or system (50).

11 Claims, 3 Drawing Sheets

(56) References Cited

U.S. PATENT DOCUMENTS

| | | | |
|---|---|---|---|
| 9,716,440 B2* | 7/2017 | Kaeriyama | H04B 5/266 |
| 9,866,332 B2* | 1/2018 | Oh | H04B 15/005 |
| 10,069,650 B2* | 9/2018 | Munoz | H04L 12/6418 |
| 10,326,375 B1* | 6/2019 | Pentakota | H03F 3/2173 |
| 10,397,025 B2* | 8/2019 | Al-Shyoukh | H04L 25/085 |
| 10,601,614 B1* | 3/2020 | Liu | H04L 27/2275 |
| 10,840,861 B1* | 11/2020 | Al-Shyoukh | H03F 3/45188 |
| 11,689,174 B2* | 6/2023 | Zhan | H03C 1/62 |
| | | | 375/219 |
| 2004/0116094 A1* | 6/2004 | Eastwood | H04L 1/24 |
| | | | 455/323 |
| 2011/0043281 A1* | 2/2011 | Golden | H03F 3/45475 |
| | | | 330/252 |
| 2011/0227641 A1 | 9/2011 | Weiss et al. | |
| 2011/0317460 A1* | 12/2011 | Garces | H02J 3/38 |
| | | | 333/175 |
| 2018/0062678 A1* | 3/2018 | Ragonese | H01F 19/04 |
| 2018/0123514 A1* | 5/2018 | Yong | H03L 7/06 |
| 2019/0068410 A1* | 2/2019 | Al-Shyoukh | H04L 25/08 |
| 2021/0033662 A1* | 2/2021 | Al-Shyoukh | G01R 31/52 |
| 2021/0313895 A1* | 10/2021 | Schaible | H01F 3/10 |
| 2022/0006386 A1* | 1/2022 | Yang | H02M 1/342 |
| 2022/0103197 A1* | 3/2022 | Briseno-Vidrios | H04B 1/123 |

FOREIGN PATENT DOCUMENTS

| | | |
|---|---|---|
| DE | 102012209276 A1 | 12/2013 |
| JP | 2011146934 A | 7/2011 |

* cited by examiner

INTERFERENCE-FREE TRANSMISSION OF SIGNALS BETWEEN DIFFERENT EARTH POTENTIALS

BACKGROUND OF THE INVENTION

The present invention relates to devices for transmitting signals between a transmitter having a first ground potential and a receiver having a second ground potential.

Electric motors in the drive train of electrically driven vehicles are generally supplied with a multiphase AC voltage. The electrical energy is usually provided as DC voltage on board the vehicle by way of batteries, fuel cells or other energy sources. The multiphase AC voltage is generated from this DC voltage using an inverter. For this purpose, the phases of the AC voltage supply for the electric motor are connected alternately to the positive pole and the negative pole of the DC voltage source with rapid temporal clocking. This is achieved by way of an arrangement of switching elements in the inverter. DE 10 2012 209 276 A1 discloses an inverter based on semiconductor switching elements including a drive circuit for the gates of the switching elements that comprises corresponding gate drivers.

The gate drivers of the switching elements that are connected between the negative pole of the DC voltage source and the phases of the AC voltage supply, also referred to as "low-side" switching elements, are generally supplied with a common gate driver voltage supply. The rapidly clocked switching of the individual switching elements of the inverter during normal operation of the inverter induces voltages in parasitic inductances of the electrical connection lines between the DC voltage potentials and the switching elements, which voltages lead to a ground offset between the different gate drivers that are associated with the individual phases of the AC voltage supply.

In certain operating situations, in particular identical control signals for the "low-side" switching elements have to be transmitted rapidly between these "low-side" switching elements. One example of operating situations of this kind are fault states, in particular a malfunction of the inverter or a detected short circuit in the electrical drive train, in which the phases of the AC voltage supply are short-circuited in relation to one another by the inverter by means of the "low-side" switching elements with an "active short circuit". In order to overcome the ground offset between the individual "low-side" gate drivers which occurs in this case and can be temporarily up to 200 V, potential-isolating transformers are used for transmitting signals between the "low-side" gate drivers.

SUMMARY OF THE INVENTION

Within the scope of the invention, a coupler for the differential transmission of an analog signal, output by at least one transmitter having a first ground potential, via at least a first signal line and a second signal line, to a receiver having a second ground potential has been developed. This coupler has a filter arrangement for the components of the signal that are transmitted via the first signal line and via the second signal line. In this case, the filter arrangement is either potential-free or it uses the second ground potential, that is to say it has the ground potential in common with the receiver. The components of the signal that are filtered by the filter arrangement are combined in a comparator to form the signal to be supplied to the receiver. The comparator uses the second ground potential.

It has been recognized that in this way a ground offset between transmitter and receiver can be overcome without potential-isolating components. Instead, the coupler can be formed with a circuit that manages with discrete components. This brings about a substantial cost advantage since potential-isolating components are very expensive.

Differential transmission is at the same time also particularly well suited to suppressing interference that is coupled into the signal lines by the ground offset which is constantly changing with respect to time. Namely, this interference is essentially common-mode interference. A large amount of the common-mode interference is already removed by the calculation in the comparator subtracting the components of the signal that are transmitted via the two signal lines from one another. This reduces the requirements relating to the filter arrangement connected upstream which in turn determine the time constant of said filter arrangement and therefore the possible signal transmission rate. In particular in the case of the transmission of safety-relevant control signals, for example for the active short circuit, the delay time is an important characteristic variable. It would therefore be possible in principle both to overcome the ground offset and to suppress the interference imparted to the signal by changes in the ground offset using a simple RC filter circuit without resorting to differential transmission. For this, the RC filter circuit would have to have a time constant of the order of magnitude of 20 μs, however, which is already too slow for many safety-relevant applications. Time constants that are substantially faster can be used with differential transmission.

In one advantageous configuration, the filter arrangement comprises a common-mode choke. In the common-mode choke, the components of the signal that are transmitted via the two signal lines are guided onto magnet coils that are wound in opposite directions such that the magnetic fields of the common-mode interference contained in the two signal components cancel one another out and the common-mode interference is therefore inductively attenuated. The time constant here is only limited by the cut-off frequency of the core onto which the two magnet coils are wound.

In a further advantageous configuration, the filter arrangement comprises a first low-pass filter for that component of the signal that is transmitted via the first signal line and a second low-pass filter for that component of the signal that is transmitted via the second signal line. These low-pass filters can be in the form of RC filters, for example, wherein time constants that are substantially faster than in the case of non-differential transmission are possible. For example, the low-pass filters can have time constants of at most 5 μs, preferably of at most 2 μs. These time constants are still slower than for a common-mode choke. To this end, an implementation with low-pass filters is smaller and cheaper to construct as a magnetic core is not required.

The ground offset between the first ground potential and the second ground potential can lead to the comparator being loaded in the sense that voltages not conforming to specifications are applied to its inputs. In a further particularly advantageous configuration, the coupler therefore comprises at least one polarity reversal protection element which is designed to divert a voltage that is present on at least one signal line and is outside of the specification of at least one input of the comparator away from this input. In this way, premature wear of semiconductor-based comparators can be advantageously avoided in particular.

For this purpose, the polarity reversal protection element can comprise a series circuit of two diodes that is connected in the reverse direction between two predetermined potentials, for example. The protected input of the comparator is then connected to the connection between the two diodes in the series circuit. The range of the voltages that may be applied to the input of the comparator can then be set using the predetermined potentials. When a voltage that is lower than the lower predetermined potential or higher than the higher predetermined potential is present on the signal line, this voltage is diverted via the diode leading to the respective potential. The two predetermined potentials serve in this respect as "charge drains".

Preferably, the input components of the filter arrangement are also configured with sufficiently high dielectric strength and to be sufficiently resistant to pulsed loads in order to take up the interference caused by the ground offset changing with respect to time. In the case of a common-mode choke for example, this relates to the dimensioning of the conductor cross section of the two opposed windings and the dielectric strength of the respective isolation. In the case of a low-pass filter in the form of an RC filter, it is mainly the resistor that is loaded.

The invention also relates to a system for the differential transmission of an analog signal, output by at least one transmitter having a first ground potential, via at least a first signal line and a second signal line, to a receiver having a second ground potential. In addition to the described coupler, this system comprises a first, inverting amplifier that forms that component of the signal that is transmitted via the first signal line from the signal of the transmitter, and a second, non-inverting amplifier that forms that component of the signal that is transmitted via the second signal line from the signal of the transmitter. The amplifiers use the first ground potential, that is to say they have the ground potential in common with the transmitter.

Not only can the amplifiers produce the differential signal pair from a single signal of the transmitter, but they can also raise the amplitudes of the signal components transmitted via the two signal lines. In this way, the signal-to-noise ratio can be further improved.

The outputs of the amplifiers can be loaded by the ground offset to the extent that voltages outside of the respective specification are applied there via the signal lines. In the case of amplifiers that are semiconductor-based, the semiconductors can wear prematurely as a result. Therefore, in a further particularly advantageous configuration, at least one polarity reversal protection element is provided which is designed to keep a voltage that is present on at least one signal line and is outside of the specification of the output of the inverting and/or non-inverting amplifier away from this output. The polarity reversal protection element in this case can in particular comprise a diode connected between the output of the inverting or non-inverting amplifier and the first or second signal line, for example.

As explained above, an important useful application of the described coupler and of the described system is the transmission of signals between multiple switching elements of an inverter which are associated with different phases of the AC voltage supply supplied by the inverter. The invention therefore also relates to a voltage converter for converting between a DC voltage at a DC voltage gate and a multiphase AC voltage at an AC voltage gate. This voltage converter comprises an arrangement of switching elements, via which each phase of the AC voltage gate can be selectively connected to the positive pole or to the negative pole of the DC voltage gate. The above-described coupler and/or the above-described system is/are provided for transmitting a control signal between a first gate driver which is associated with the first switching element of the arrangement and a second gate driver which is associated with a second switching element which is associated with another phase of the AC voltage gate.

In particular, this coupler and/or the above-described system is/are a secondary drive mechanism of the gate drivers of the switching elements, in particular of the "low-side" switching elements. This secondary drive mechanism is used only in the described particular operating situations. By means of this reliable secondary signal transmission that is robust against ground offsets, reliable operation of the AC voltage supply is ensured since an undesirable identical signal at the "low-side" switching elements leads both to undesirable torque changes of the electrical machine and to short circuits between the DC voltage potentials and therefore to malfunctions of a connected electrical machine or to destruction of the AC voltage supply. During normal operation of the AC voltage supply, the high-side and the "low-side" switching elements are preferably driven by means of a primary drive mechanism. The secondary drive mechanism of the switching elements is therefore preferably an additional drive mechanism to the primary drive mechanism. The primary drive mechanism is preferably designed as one of the known drive circuits for driving the switching elements of a voltage converter.

In this way, the control signals can also then be transmitted rapidly and uninterruptedly between the switching elements or the gate drivers of the switching elements when there is a ground offset between the switching elements or the gate drivers.

The voltage converter in this case can be operated in particular as an inverter, wherein the same effect is achieved, regardless of whether a DC voltage is converted into an AC voltage or vice versa. When the inverter is used in the electrical drive train of a vehicle, the direction of operation can also change during the journey. Upon braking, the electric motor can therefore change over to generator operation and supply energy back into the traction battery of the vehicle, for example.

For example, a B6 inverter has three "high-side" switching elements, via which in each case a phase of the AC voltage gate can be connected to the positive pole of the DC voltage gate, and three "low-side" switching elements, via which in each case a phase of the AC voltage gate can be connected to the negative pole of the DC voltage gate. When power semiconductors such as IGBTs or MOSFETs are used as switching elements, in the case of the "high-side" switching elements, the collector or the drain connection is in each case permanently connected to the positive pole of the DC voltage gate. In the case of the "low-side" switching elements, the emitter or the source connection is in each case permanently connected to the negative pole of the DC voltage gate.

Due to the phase potentials that jump between HV+ and HV− during operation of the AC voltage supply and at the same time constitute the reference potential for the respective gate drivers, in order to safely drive the "high-side" switches, the gate drivers of these switching elements are supplied with a respective independent voltage supply, in particular for each associated phase. In contrast, in order to safely drive the "low-side" switches, the gate drivers of these switching elements can be supplied with a common voltage supply since their reference potential is the static negative potential, to be assumed to be constant, of the DC voltage gate. Due to the rapid switching operations of the "low-side" switching elements during operation of the AC voltage supply, voltages that lead to a transient ground offset between the "low-side" gate drivers are induced in the connections between the "low-side" switching elements and the negative pole of the DC voltage gate.

Despite the ground offset, which in particular is especially large in an above-described particular operating situation, an improved inverter can therefore be implemented by reliable and rapid signal transmission being provided by the described coupler or system. It is simultaneously possible to comply with the requirements, for example with respect to the speed at which an active short circuit can be set in the event of a fault. Signal transmission using a potential-isolating component and dispensing with the common supply to the "low-side" switching elements would be more complex alternatives, in particular regarding the number of components, installation space and weight necessary to achieve the speed required.

The advantages of the described coupler, or of the described system, are not limited to AC voltage supplies, for example inverters, but are also evident, for example, in other devices in which power semiconductors are to be driven, for instance in DC-to-DC converters. The ground offset caused by inducing voltages in parasitic inductances is particularly pronounced, however, in the case of an inverter having a multiphase AC voltage gate.

BRIEF DESCRIPTION OF THE DRAWINGS

Further measures which improve the invention are described in more detail below together with the description of the preferred exemplary embodiments of the invention on the basis of figures.

DETAILED DESCRIPTION

Figure 1:
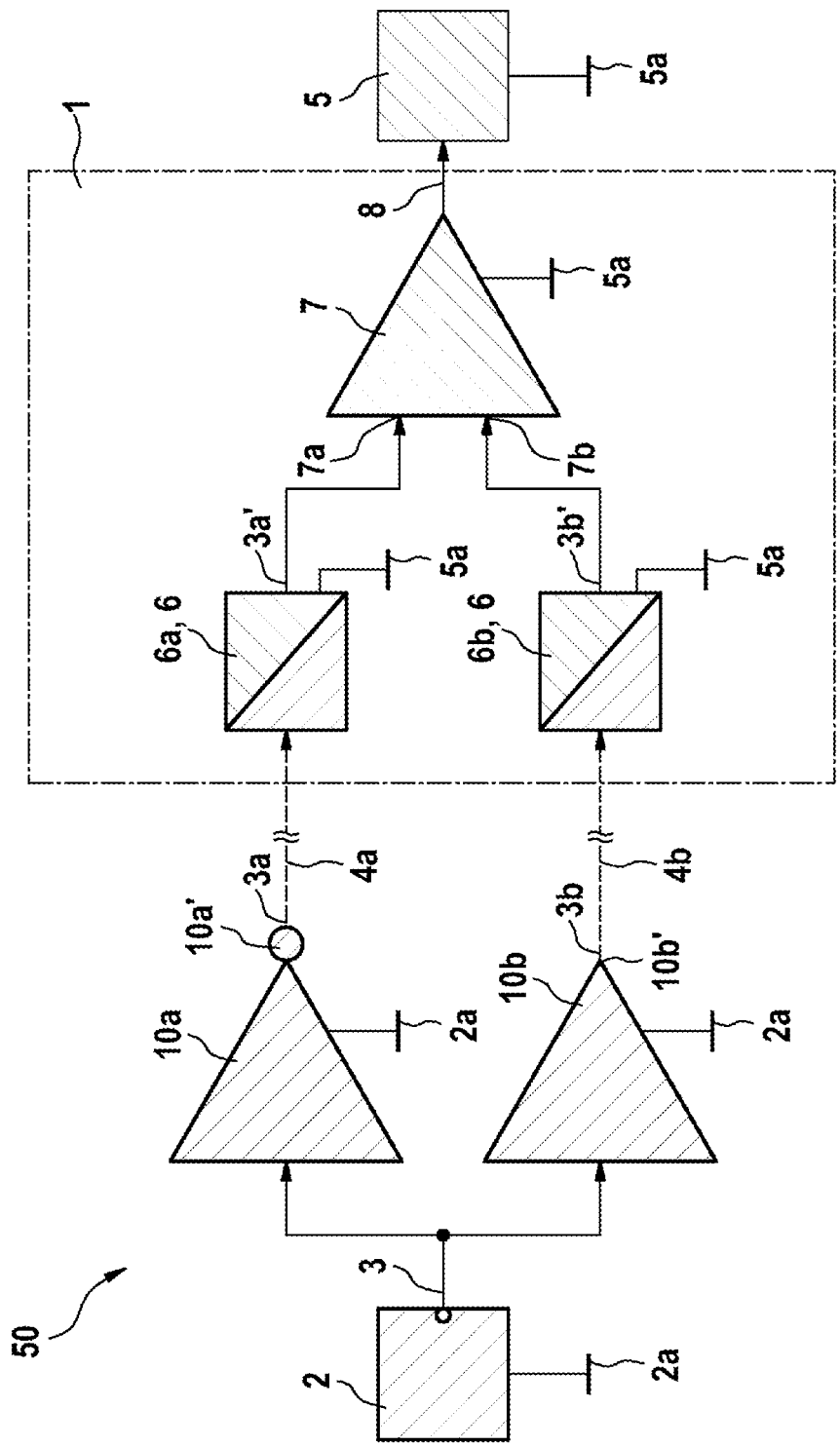
FIG. 1 shows a block diagram of an exemplary system 50 having a coupler 1.

According to FIG. 1, a signal 3 is to be transmitted by a transmitter 2 having a first ground potential 2a to a receiver 5 having a second ground potential 5a. For this purpose, the system 50 contains an inverting amplifier 10a, at the output 10a' of which a first component 3a of the signal 3 is output, and a non-inverting amplifier 10b, at the output 10b' of which a second component 3b of the signal 3 is output. The two amplifiers 10a and 10b use the first ground potential 2a, that is to say they have this in common with the transmitter 2

The components 3a and 3b of the signal 3 are transmitted via signal lines 4a and 4b to the coupler 1 that produces the signal 8 to be supplied to the receiver 5. The coupler 1 contains a filter arrangement 6 on the input side. In this example, the filter arrangement 6 comprises a first low-pass filter 6a for that component 3a of the signal 3 that is transmitted via the first signal line 4a and a second low-pass filter 6b for that component 3b of the signal 3 that is transmitted via the second signal line 4b. The two filters use the second ground potential 5a, that is to say they have this in common with the receiver 5.

The components 3a', 3b' of the signal 3 that are filtered by the filters 6a and 6b are supplied to the inputs 7a and 7b of the comparator 7. The comparator 7 subtracts the components 3a' and 3b' from one another and uses the result to form the signal 8 to be supplied to the receiver 5. The comparator uses the ground potential 5a of the receiver 5.

Figure 2:
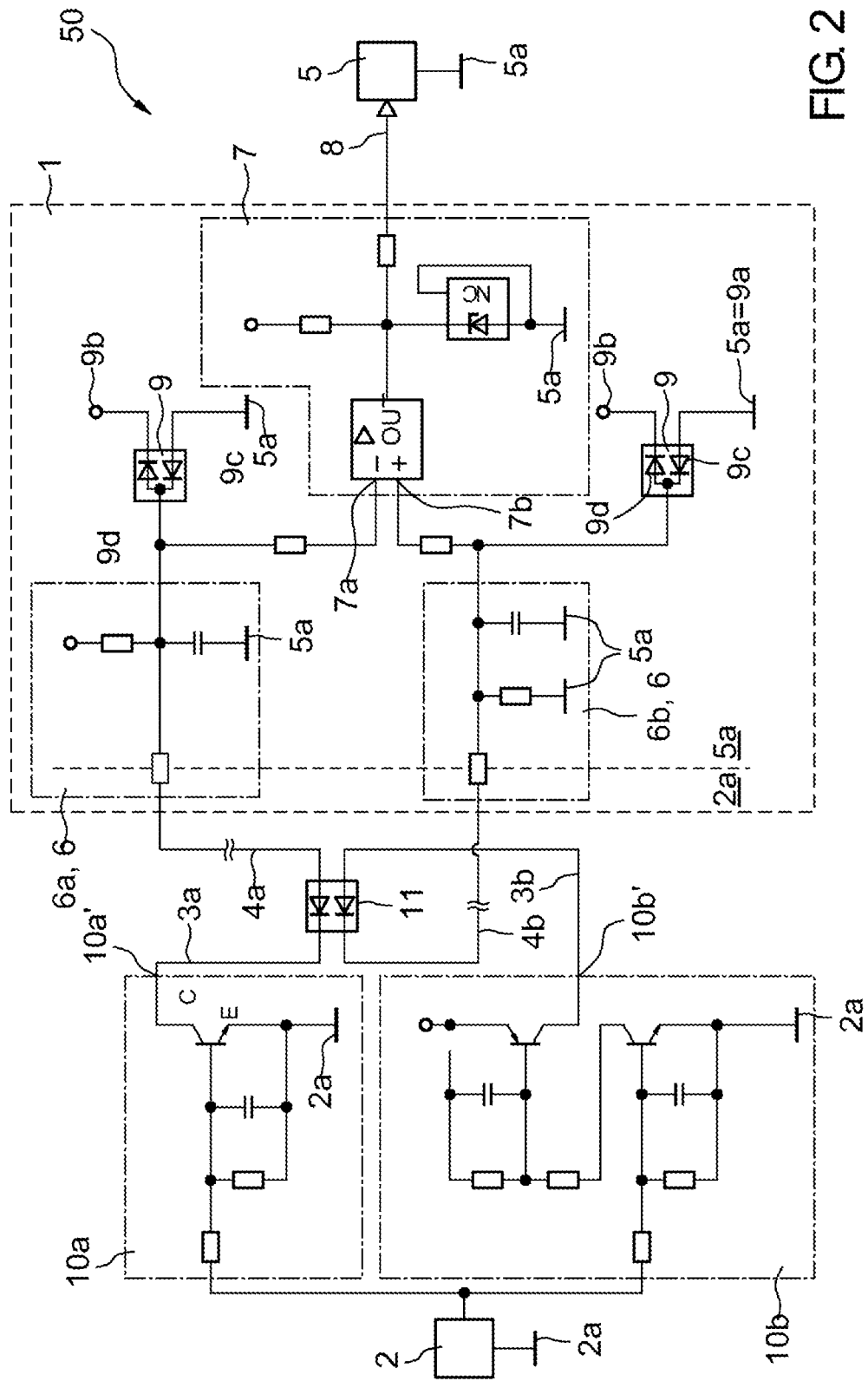
FIG. 2 shows an exemplary circuit diagram for implementing the system 50 having a coupler 1 and shown in FIG. 1.

FIG. 2 shows an exemplary circuit-based implementation of the system 1 shown in FIG. 1. Some details are visible here that have been omitted in FIG. 1 for the sake of clarity. The outputs 10a', 10b' of the amplifiers 10a, 10b are thus protected against overvoltages on the signal lines 4a and 4b by way of a polarity reversal protection element 11 that comprises two diodes in this example. Analogously, the two inputs 7a and 7b of the comparator 7 are protected by polarity reversal protection elements 9 that in each case contain a series circuit of two diodes 9c and 9d between the second ground potential 5a-9a and a further positive potential 9b. The respective input of the comparator 7a, 7b is in each case connected to the connection between the two diodes 9c, 9d in the series circuit. When the respective voltage leaves the range between the potentials 9a and 9b, it is diverted such that the comparator 7 is not loaded.

In FIG. 2, it can be additionally seen that the comparator 7, in addition to the integrated module with the inputs 7a and 7b, also has a circuit downstream of the output of this module. This circuit ensures that the signal 8 supplied to the receiver 5 is in the voltage range that the receiver 5 expects.

Within the coupler 1, it is furthermore evident that the low-pass filters 6a and 6b are each implemented as RC filters in the filter arrangement 6. Furthermore, the differences between the inverting amplifier 10a and the non-inverting amplifier 10b are discernible. The two amplifiers 10a and 10b are constructed with transistor stages in this case. Prefabricated operational amplifiers can also be used however, several of which can be combined in an integrated circuit, for example.

Figure 3:
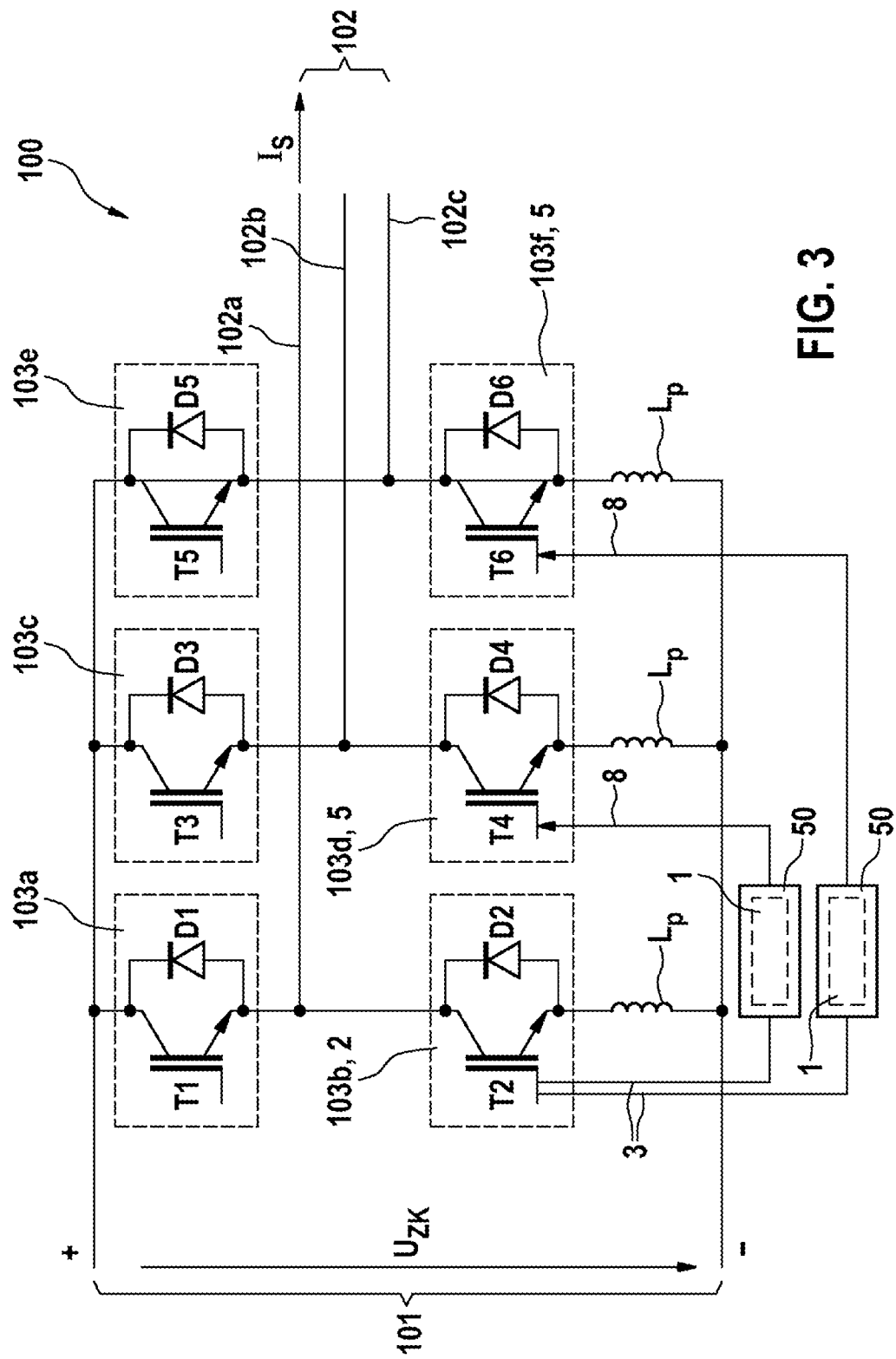
FIG. 3 shows an exemplary voltage converter 100.

FIG. 3 shows an exemplary embodiment of a voltage converter 100 which is in the form of an inverter and has a DC voltage gate 101 and an AC voltage gate 102. The voltage converter 100 is designed to convert the intermediate circuit voltage $U_{ZK}$, present at the DC voltage gate 101, into a multiphase AC voltage at the AC voltage gate 102 by way of temporal clocking of the switching elements 103a-103f so that the multiphase AC voltage drives a current Is through stator windings of an electric motor not depicted in FIG. 3.

Drive circuits, in particular gate drivers, for driving the gates of the switching elements 103a-103f are also not depicted in FIG. 3 for the sake of clarity. In particular, the drive circuits of the "high-side" switching elements 103a, 103c and 103e are supplied by separate voltage supplies independently of one another. The drive circuits of the "low-side" switching elements 103b, 103d and 103f are supplied by a common voltage supply, a common gate driver voltage supply. In the event of a fault, this can lead to particularly high ground offsets between the "low-side" switching elements 103b, 103d and 103f, in particular the drive circuits of the "low-side" switching elements 103b, 103d and 103f. To prevent the signal transmission between the "low-side" switching elements 103b, 103d and 103f, in particular the drive circuits of the "low-side" switching elements 103b, 103d and 103f, from responding incorrectly, it is necessary to transmit a control signal 3 reliably from a "low-side" switching element 103b, acting as transmitter 2, to the other two "low-side" switching elements 103d and 103f, acting as receiver 5, by means of the coupler in the system of the voltage converter. As a consequence of the independent rapid clocking of the switching elements 103b, 103d, 103f during normal operation of the AC voltage supply, voltages are induced in the unavoidable parasitic inductances $L_p$ in the respective connections to the negative pole of the DC voltage gate 101 and lead to a ground offset between the "low-side" switching elements 103b, 103d, 103f, in particular the drive circuits of the "low-side" switching elements 103b, 103d and 103f. Desired transmission of the control signal 3 is achieved by means of the system 50 with integrated coupler 1, despite the ground offset. The arrangement or placing of the systems 50 in FIG. 3 is purely schematic. In reality, the system 50 is positioned as closely as possible to the respective receiver 5.

In a similar way, the parasitic inductances $L_p$ are also present in the connections between the "high-side" switching elements 103a, 103c, 103e, on the one hand, and the positive pole of the DC voltage gate 101, on the other hand. This is not depicted in FIG. 3, however, since the effect of the voltages induced here is canceled out by the independent supply of the "high-side" switching elements 103a, 103c, 103e.

The invention claimed is:

1. A system (50) for the differential transmission of an analog signal (3), output by at least one transmitter (2) having a first ground potential (2a), via at least a first signal line (4a) and a second signal line (4b), to a receiver (5) having a second ground potential (5a), the system comprising:
   a first, inverting amplifier (10a) that generates a first component (3a) of the signal (3) that is transmitted via the first signal line (4a),
   a second, non-inverting amplifier (10b) that generates a second component (3b) of the signal (3) that is transmitted via the second signal line (4b),
   a coupler (1) having a filter arrangement (6) configured to receive the first component (3a) of the analog signal (3) via the first signal line (4a) and the second component (3b) of the analog signal (3) via the second signal line (4b) and filter each of the first component (3a) and the second component (3b) separately, wherein the filter arrangement (6) is potential-free or uses the second ground potential (5a),
   a first polarity reversal protection element (11) comprising at least two diodes and disposed between the coupler (1) and the first and second amplifiers (10a, 10b), wherein the first signal line (4a) extends through one of the at least two diodes and the second signal line (4b) extends through another of the at least two diodes,
   a comparator (7), wherein the first component (3a') and the second component (3b'), after being filtered by the filter arrangement (6), are combined in the comparator (7) to form a signal (8) to be supplied to the receiver (5), wherein the comparator (7) uses the second ground potential (5a), wherein the amplifiers (10a, 10b) use the first ground potential (2a) and wherein the comparator (7) subtracts the first component (3a') and the second component (3b') transmitted via both signal lines from one another, and
   a second polarity reversal protection element (9) configured to divert a voltage that is present on at least one signal line (4a, 4b) and is outside of the specification of at least one input (7a, 7b) of the comparator (7) away from this input (7a, 7b), wherein the second polarity reversal protection element (9) comprises a series circuit of two diodes (9c, 9d) that is connected in the reverse direction between two predetermined potentials (9a, 9b), and wherein the input (7a, 7b) of the comparator (7) is connected to the connection between the two diodes (9c, 9d) in the series circuit.

2. The system (50) as claimed in claim 1, wherein the first polarity reversal protection element (11) comprises at least one diode connected between the output (10a', 10b') of the inverting or non-inverting amplifier (10a, 10b) and the first or second signal line (4a, 4b).

3. A voltage converter (100) for converting between a DC voltage at a DC voltage gate (101) and a multiphase AC voltage at an AC voltage gate (102), comprising an arrangement of switching elements (103a-103f), via which each phase (102a-102c) of the AC voltage gate (102) can be selectively connected to the positive pole or to the negative pole of the DC voltage gate (101), wherein a coupler (1) is provided for transmitting an analog control signal (3) between a first gate driver which is associated with the first switching element (103a-103f) of the arrangement and a second gate driver which is associated with a second switching element (103a-103f) which is associated with another phase (102a-102c) of the AC voltage gate (102), wherein the coupler (1) transmits the control signal (3) output by at least one transmitter (2) having a first ground potential (2a), via at least a first signal line (4a) and a second signal line (4b), to a receiver (5) having a second ground potential (5a), wherein the coupler (1) comprises:
   a filter arrangement (6) configured to receive a first component (3a) of the signal (3) transmitted via the first signal line (4a) and a second component (3b) of the signal (3) via the second signal line (4b) and filter each of the first component (3a) and the second component (3b) separately, wherein this filter arrangement (6) is potential-free or uses the second ground potential (5a);
   a polarity reversal protection element (9); and
   a comparator (7),
   wherein the first component (3a') and the second component (3b'), after being filtered by the filter arrangement (6), are combined in the comparator (7) to form a signal (8) to be supplied to the receiver (5), and wherein the comparator (7) uses the second ground potential (5a), and wherein the comparator (7) subtracts the first component (3a') and the second component (3b') transmitted via both signal lines from one another,
   wherein the polarity reversal protection element (9) is designed to divert a voltage that is present on at least one signal line (4a, 4b) and is outside of the specification of at least one input (7a, 7b) of the comparator (7) away from this input (7a, 7b), and
   wherein the polarity reversal protection element (9) comprises a series circuit of two diodes (9c, 9d) that is connected in the reverse direction between two predetermined potentials (9a, 9b), and wherein the input (7a, 7b) of the comparator (7) is connected to the connection between the two diodes (9c, 9d) in the series circuit.

4. The voltage converter of claim 3, wherein the filter arrangement (6) comprises a common-mode choke.

5. The voltage converter of claim 3, wherein the filter arrangement (6) comprises a first low-pass filter (6a) for the first component (3a) of the signal (3) that is transmitted via the first signal line (4a) and a second low-pass filter (6b) for the second component (3b) of the signal (3) that is transmitted via the second signal line (4b).

6. The voltage converter of claim 5, wherein the low-pass filters (6a, 6b) have time constants of at most 5 µs.

7. The voltage converter of claim 3, wherein the first component (3a) is received at the filter arrangement (6) from an inverting amplifier (10a) and the second component (3b) is received at the filter arrangement (6) from a non-inverting amplifier (10b).

8. The system (50) as claimed in claim 1, wherein the filter arrangement (6) comprises a common-mode choke.

9. The system (50) as claimed in claim 1, wherein the filter arrangement (6) comprises a first low-pass filter (6a) for the first component (3a) of the signal (3) that is transmitted via the first signal line (4a) and a second low-pass filter (6b) for the second component (3b) of the signal (3) that is transmitted via the second signal line (4b).

10. The system (50) as claimed in claim 1, wherein the low-pass filters (6a, 6b) have time constants of at most 5 µs.

11. The system (50) as claimed in claim 1, wherein the first component (3a) is received at the filter arrangement (6) from an inverting amplifier (10a) and the second component (3b) is received at the filter arrangement (6) from a non-inverting amplifier (10b).

\* \* \* \* \*